United States Patent [19]
George et al.

[11] 3,938,241
[45] Feb. 17, 1976

[54] VERTICAL CHANNEL JUNCTION FIELD-EFFECT TRANSISTORS AND METHOD OF MANUFACTURE

[75] Inventors: William Lloyd George; Robert Guy Hays; Chongkook John Rhee, all of Scottsdale, Ariz.

[73] Assignee: Motorola, Inc., Chicago, Ill.

[22] Filed: June 24, 1974

[21] Appl. No.: 482,528

Related U.S. Application Data
[62] Division of Ser. No. 301,575, Oct. 24, 1972.

[52] U.S. Cl. .................... 29/571; 357/22; 29/580; 148/175
[51] Int. Cl.² .......................................... B01J 17/00
[58] Field of Search .......... 29/571, 580; 357/22, 34; 148/175

[56] References Cited
UNITED STATES PATENTS

| | | | |
|---|---|---|---|
| 3,054,034 | 9/1962 | Nelson | 357/34 |
| 3,274,461 | 9/1966 | Teszner | 357/22 |
| 3,363,153 | 1/1968 | Zloczower | 29/580 |
| 3,738,877 | 6/1973 | Davisohn | 29/580 |

*Primary Examiner*—W. Tupman
*Attorney, Agent, or Firm*—Harry M. Weiss; Maurice J. Jones, Jr.

[57] ABSTRACT

The disclosed junction field-effect transistor (FET) has a precisely controlled gate configuration which enables either high power operation or high frequency operation or both. The FET is manufactured by steps including the growing of a first epitaxial layer having a predetermined crystallographic orientation on a substrate to form a drain. Next, a first anisotropic etch of the epitaxial layer provides "U"-shaped grooves with flat bottoms, therein through which a gate is diffused having internal side walls of uniform depth that define the source-to-drain channel. A second epitaxial layer is then grown on the surface of the first epitaxial layer and of the gate to provide a source. A second anisotropic etch exposes a portion of the gate, which also forms an etch stop, to facilitate electrical contact thereto. Current flowing through the channel is controlled in response to an input signal applied between the gate and source which adjusts the thickness of a depletion region extending into the channel.

12 Claims, 17 Drawing Figures

VERTICAL CHANNEL JUNCTION FIELD-EFFECT TRANSISTORS AND METHOD OF MANUFACTURE

This is a division, of application Ser. No. 301,575, filed Oct. 24, 1972.

BACKGROUND OF THE INVENTION

Because the electrical characteristics of field-effect transistors (FETS) are in some respect superior to those of vacuum tubes and bipolar transistors, FETs are being employed in increasing numbers in electronic equipment. More particularly, Fets have high input and output impedances, more nearly linear transfer functions, low noise generation and desirable temperature characteristics. As a result, FETs are now widely utilized in low power applications such as communication receiver RF amplifiers, oscillators and mixers.

Lateral channel FETs have limitations which restrict their utilization in high frequency and high power applications. For instance, these FETs often have diffused gate structures which run parallel to the lateral source-to-drain channels thereof to provide undesirably long channels. Since this gate and the lateral source-to-drain channel are separated by a depletion region, parasitic capacitances and resistances are provided between the gate, source and drain. These parasitic capacitances and resistances may attenuate the high frequency gain of even small signal devices.

Moreover, as the size of a lateral FET device is increased to accommodate higher power levels, the cost increases more rapidly than for a bipolar transistor having similar capability. This is because the topographical gate configurations of a lateral FET requires about five times as much chip area as a bipolar transistor handling the same power level. Thus, the cost of lateral power FET is significantly higher than the cost of a comparable bipolar transistor. As a result, even interdigitated lateral FETs are not often employed for amplifying VHF radio frequency signals having power levels of a watt and above because of cost and neutralization problems.

Partly because of the above problems with lateral channel FETs, vertical channel FET structures are being investigated for utilization in high frequency, high power applications since their structures may inherently have shorter channel-lengths and thus less parasitic capacitance and resistance than lateral channel structures. But prior art versions of vertical channel FETs also present problems, two techniques have been employed for shaping the gate and thus the source-to-drain channel structures in such devices. One technique involves a standard diffusion of the gate and the other technique employs a nonpreferential or isotropic etch to form recesses through which the gate is diffused. In either case, these prior art methods result in gates having undesirable curved surfaces defining curved source-to-drain channels extending therebetween. Also, such prior art gates sometimes have graded impurity concentrations and surfaces with imprecisely controlled shapes and spacial relationships. Consequently, the depletion region unpredictably extends across the source-to-drain channel between some portions of the gate and not at others. As a result, these prior art FETs have transfer characteristics which are more analogous to those of a triode vacuum tube rather than to the more desired characteristics of a pentode vacuum tube. Furthermore, because these prior art processes do not result in precise control of either the gate or source-to-drain structures, greater control of mask dimensions and materials may be employed thereby increasing the chip size above what it could be if precise channel shaping was utilized. This inefficient use of the die area results in a low number of devices yielded per wafer and increased expense as compared to processes forming bipolar transistors. Also, diffusions used to contact buried prior art gate structures and to isolate individual devices cause out-diffusion of shallow gate structures thereby undesirably increasing the gate length and distorting the gate configuration. Hence, the characteristics of these prior art, vertical channel FETs have been neither satisfactory nor predictable enough to justify large scale production.

BRIEF SUMMARY OF THE INVENTION

One object of this invention is to provide an improved structure and method of manufacture for a junction FET.

Another object is to provide an inexpensive and reliable method of manufacture and a FET structure which is suitable for being used in high frequency applications.

A further object is to provide a method of manufacture and structure for a vertical channel, junction FET which is suitable for use in high power applications.

A still further object of this invention is to provide a FET structure which makes efficient use of die area.

An additional object of this invention is to provide a vertical channel, junction FET structure which has a minimal amount of parasitic resistance and capacitance associated therewith and more predictable characteristics than prior art vertical channel FETs having the same drain saturation current specification.

A still additional object is to provide a structure or process of making buried gate FET structure wherein the gate configuration is not distorted by either the gate contacting or isolation steps.

In brief, the invention relates to a method or process of manufacture and a structure for a vertical channel junction FET. The process includes the steps of growing an epitaxial layer of a first conductivity type with a [110] crystallographic orientation. Next, a selected pattern is provided by photolighographic techniques in a silicon dioxide layer which covers one surface of the epitaxial layer. An anisotropic etch then provides interconnected grooves having rectangular horizontal cross-sections and flat bottomed U-shaped vertical cross-sections which extend part way into the epitaxial layer. Each of the grooves has substantially vertical exposed side surfaces which face each other and an exposed bottom surface. A shaping etch is next performed to round out the inside corners of the grooves. Then a heavily doped gate of the second conductivity type is provided by a shallow diffusion, accompanied by a steam retardant, through the exposed side and bottom surfaces of the grooves. The anisotropic and groove shaping etches and the steam retardant result in a plurality of interconnected gate portions each having a substantially U-shaped vertical cross-section and a ladder-like, horizontal top section. The vertical side walls of the gate define the source-to-drain channel. After the silicon dioxide pattern is removed, a second epitaxial layer of the first conductivity type also having the [110] crystallographic orientation is grown in the grooves and on the channel surface of the first epitaxial layer which was previously covered by the silicon dioxide mask. Electrical contact to the gate along with isolation is facilitated by forming another etch mask which registers with selected portions of the now buried gate structure. This mask controls a second anisotropic etch which cuts through the second epitaxial layer until it reaches the gate structure which provides an automatic etch stop. The precisely controlled gate configuration results in a junction FET having a controlled vertical channel. The resulting FET has predictable electrical characteristics and requires a minimum chip area.

DETAILED DESCRIPTION

Figure 1:
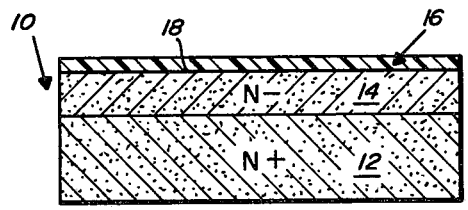
FIG. 1 is an enlarged cross-sectional view of the starting material for the FET of the invention.

The process of manufacture and structure of one embodiment of a vertical channel, junction FET made in accordance with the invention is described below. FIG. 1 illustrates the cross-section of a segment of wafer 10 of a suitable starting material. More specifically, substrate 12 is provided by slicing along a [110] plane and polishing in a known manner a single crystal ingot which was previously heavily doped with donor impurities. N+ substrate 12 may be on the order of 14 mils thick and have a low resistivity from between 0.0009 to 0.005 ohm-centimeters (ohm-cm). Epitaxial layer 14 has the same [110] crystallographic orientation as the substrate because the crystals thereof are oriented by the [110] surface of substrate 12 on which they are formed. The thickness of N-layer 14 may be on the order of three microns and its resistivity may be between 0.3 and 0.5 ohm-cm.

Figure 2:
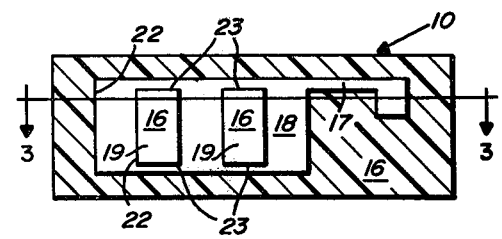
FIG. 2 is a top view illustrating a pattern in the silicon dioxide layer of FIG. 1 which provides an etch mask.
Figure 3:
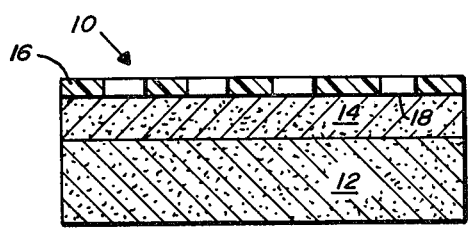
FIG. 3 is a cross-section taken along lines 3—3 of FIG. 2.

Next, a thin layer 16 of silicon dioxide is deposited or grown on top surface 18 of epitaxial layer 14. As illustrated in FIG. 2 and 3, an etch mask is formed in silicon dioxide layer 16 by using known photolithographic techniques such that the longer sides of rectangles 19, shown in the top view of FIG. 2, are aligned with a [111] plane. The mask outlines gate conductor and contact support region 17. A first anisotropic or preferential etch is performed by exposing the top surface of wafer 10 to a potassium hydroxide (KOH) based solution. Since this etchant removes semiconductor material in a direction perpendicular to [110] planes about 50 times as fast as in the direction perpendicular to [111] planes, the material beneath the exposed [110] plane is selectively removed.

Figure 4:
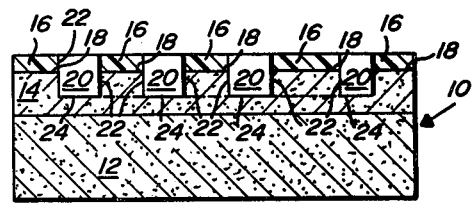
FIG. 4 shows the vertical, cross-sectional shape of grooves provided by a first anisotropic etch controlled by the etch mask of FIGS. 2 and 3.

Hence, juxta-positioned grooves 20 are provided, which have flat bottomed U-shaped vertical cross-sections as shown in FIG. 4 and rectangular horizontal cross-sections. Grooves 20 extend through areas of surface 18 not covered by silicon dioxide 16 and into epitaxial layer 14 in a direction perpendicular to the [110] planes thereof. Bottom surfaces 24 of grooves 20 are located from one to two microns beneath upper surface 18 of epitaxial layer 14. Also, grooves 20 have generally rectangular bottom and side rectilinear surface configurations.

Groove side surfaces 22, which are aligned with the [111] planes and perpendicular to the [110] planes, tend to be nearly vertical because of the aforementioned property of the KOH etch whereas side surfaces 23, which are not aligned with the [111] planes, tend to be somewhat sloped. The sloped side surfaces do not adversely affect the electrical characteristics of the FET because the controlling depletion will extend between vertical side surfaces 22 rather than between sloped side surfaces 23. Moreover, there is virtually no undercut immediately beneath the boundary where surface 18 of epitaxial layer 14 joins silicon dioxide layer 16. Vertical side surfaces 22 facilitate the formation of a substantially vertical gate and source-to-drain channel structures or regions having rectilinear sides which are substantially parallel to each other and which result in an operable high frequency FET. The rectangularly shaped top configuration of the grooves results in a device having a long gate width per area of chip to provide an inexpensive, high power FET.

Figure 5:
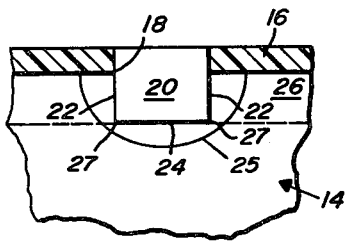
FIG. 5 is a cross-sectional view of a portion of a gate portion diffused into one of the grooves of FIG. 4.

FIG. 5 shows an undesirable rounded diffusion pattern 25 which results if a gate diffusion is performed through vertical sides surfaces 22 and horizontal bottom surface 24 of one of grooves 20. The rounded configuration of gate diffusion 25 would result in a source-to-drain channel 26 having an uneven cross-section thereby causing the resulting FET to exhibit "soft" pinch-off along with other undesirable characteristics. Diffused region 25 extends deep into epitaxial material 14 along surface 18, as shown in FIG. 5, because silicon dioxide 16 accelerates diffusant atoms introduced in proximity thereto. Moreover, the diffused region extends less through the sharp inside corners 27 where side surfaces 22 join bottom surface 24 than through the flat surfaces presented by the rest of the groove.

Figure 6:
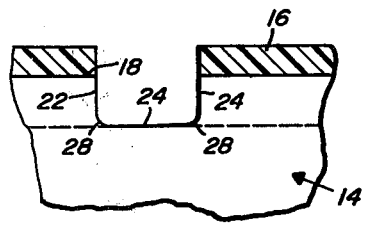
FIG. 6 shows the shape of one of the grooves of FIG. 4 after a groove shaping etch.

To avoid rounded diffusion 25, a groove shaping etch is performed before the gate is diffused and a retardant is applied along with the gate diffusion. The groove shaping etchant, which may be comprised of sulphur hexafluoride gas, (SF$_6$) removes material from the flat surfaces of the groove to round otherwise sharp inside corners 27 and where the side surfaces join each other, to provide rounded corners 28 of FIG. 6 and 8. Rounded corners 28 enable the diffusant to penetrate deeper at these corners than if they were not rounded. Moreover, steam is applied simultaneously with the diffusant and forms an oxide on the exposed flat surfaces of grooves 20 to act as a diffusion retardant through the corner surfaces. The oxide tends to even out the depth of penetration of the diffusant into the exposed surfaces of the epitaxial material.

Figure 7:
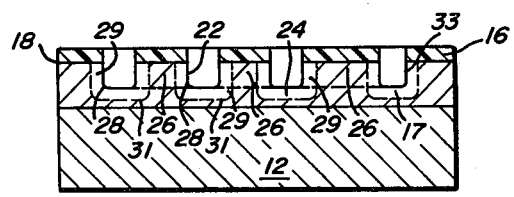
FIG. 7 is a cross-sectional view of the gate structure diffused through grooves each having the shape shown in FIG. 6.
Figure 8:
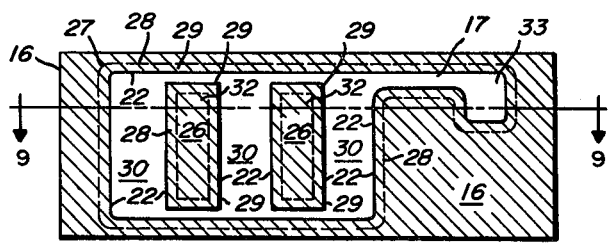
FIG. 8 is a plan view of the structure of FIG. 7.

Hence, as the exposed surfaces of grooves 20 are subjected to shallow P+ boron gate diffusion, which penetrates into the sides and bottoms of grooves 20, but which does not penetrate through surfaces masked by silicon dioxide layer 16, junctions or boundaries 31 of integral gate portions having buried bottom and side surfaces are thereby created as shown in FIG. 7. Gate 29 is comprised of a juxta-positioned integral segments forming generally U-shaped vertical cross-sections, each of which is comprised of vertical side segments joined by an integral flat bottom segment. Gate 29 has a ladder-like top horizontal configuration having a continuous periphery, as illustrated in FIG. 8. Adjacent vertical side segments of gate 29 are substantially parallel and result in source-to-drain channel portions 26 having defined shapes and short lengths which reduce parasitic capacitances and resistances and to result in a FET having high gain at high frequencies, predictable characteristics and sharp pinch-off. For instance, channel lengths as short as 1.5 microns can be obtained by the process of the invention as compared to 4.5 microns for prior art lateral junction FET devices.

The gate diffusion concentration is greatest at the outside of surfaces 22 and 24 of the side and bottom segments and decreases as the diffused region extends farther into epitaxial layer 14. The surface concentration bordering the channel is uniform rather than graded. The depth of the gate diffusion, which also forms gate conductor and contact support 33, is on the order of from 0.5 to 1 micron and its resistivity is as low as possible, i.e., on the order of 6 to 7 ohms per square, so that the top surface thereof can function as an etch stop in the manner disclosed by patent application entitled "Etch Stop for KOH Anisotropic Etch," Ser. No. 171,455, filed Aug. 13, 1971 and assigned to the assignee of the subject application. The resistivity of the gate is also made low to reduce gate resistance which enables high frequency response.

Figure 9:
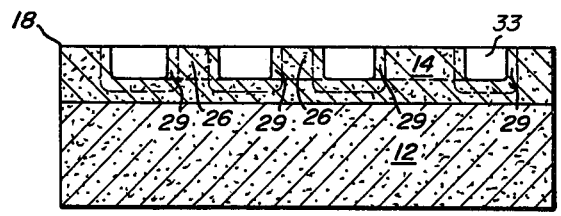
FIG. 9 is a cross-section taken along lines 9—9 of the structure of FIG. 8 after the silicon dioxide mask has been removed therefrom.

FIG. 8 is a top view of the structure of FIG. 7 looking down upon the surface of silicon dioxide layer 16. Rectangles 30 of FIG. 8 indicate the top shape of grooves 20 which are surrounded by P+ gate 29. Rectangles 32, which are included in rectangles 19 of FIG. 2, indicate the top shape of the vertical source-to-drain channel portions 26 which are covered by silicon dioxide layer 16 and which extend through, are surrounded by and form a junction with gate boundary 31. Rectangles 30 and 32 have approximately equal dimensions which vary with the characteristics of the FET but may have lengths on the order of from 2 to 4 mils and widths on the order of 0.1 mil. Although two source-to-drain channel portions 26 have been illustrated in the drawing, a greater or lesser number of such portions may be provided to meet particular electrical specifications. The ladder-like top configuration of gate 29 increases the gate width per area of chip to thereby increase the power handling capability per unit area as compared to prior art lateral channel FETs. By using the top configuration of FIG. 8 a power FET having a given rating can be provided within about the same area as a comparable bipolar. With the dimensions given each FET may have a gate width of about 2 to 4 mils. FIG. 9 is a cross-sectional view which corresponds to the top view of FIG. 8 but with silicon dioxide layer 16 removed.

Figure 10:
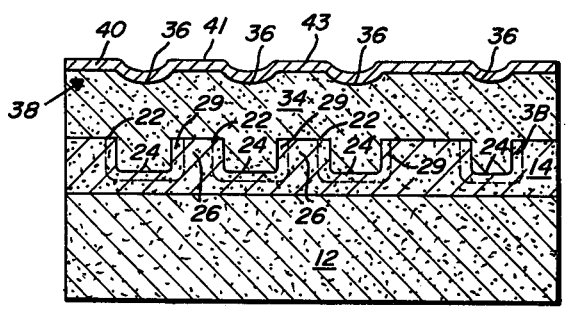
FIG. 10 illustrates a second epitaxial layer, having a selected crystallographic orientation, formed on the structure of FIG. 9 and including contact layer.

As illustrated in FIG. 10, after silicon dioxide layer 16 is removed, another N-type epitaxial layer 34 is grown on all upper surfaces of epitaxial layer 14 and on the exposed surfaces of gate 29. Epitaxial layer 34, which also is of the [110] crystallographic orientation because it is grown on layer 14 which is of the [110] orientation, fills grooves 20 and joins with the top surface 18 of source-to-drain channel portions 26 to form a source which is an integral extension thereof. Dips 36 in top surface 38 of epitaxial layer 34 are not as deep as grooves 20 because epitaxial layer 34 grows faster in this case on the [110] plane and grooves 20 tend to trap more of the silicon particles forming layer 34 per unit of surface than to planar top surfaces 18. N-type epitaxial layer 34 may have a resistivity, e.g., between 0.1 and 0.3 ohm-cm, within the range necessary to sustain voltages greater than the required gate-to-source breakdown voltage. Top layer 40 of epitaxial layer 34, which has a top surface 41, is formed by increasing the amount of dopant introduced into the semiconductor material while this layer is epitaxially growing to form an N+ contact surface for making an ohmic contact with aluminum metallization that is subsequently applied. Contact layer 40 may have a thickness on the order of 0.5 microns and epitaxial layer 34 may have a thickness on the order ob 3 microns.

Figure 11:
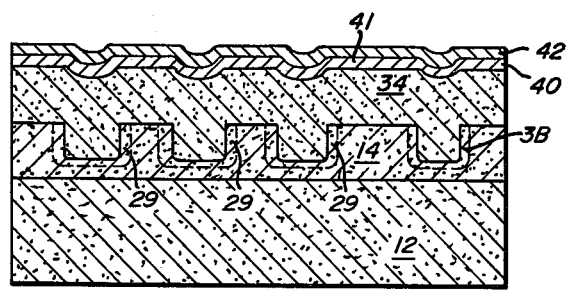
FIG. 11 illustrates a silicon dioxide surface layer on the structure of FIG. 10.
Figure 12:
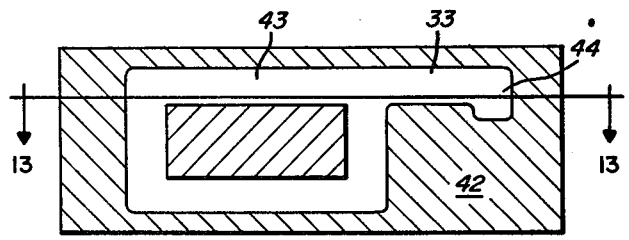
FIG. 12 is a top view of the structure of FIG. 11 showing a second etch mask provided by the silicon dioxide surface layer.
Figure 13:
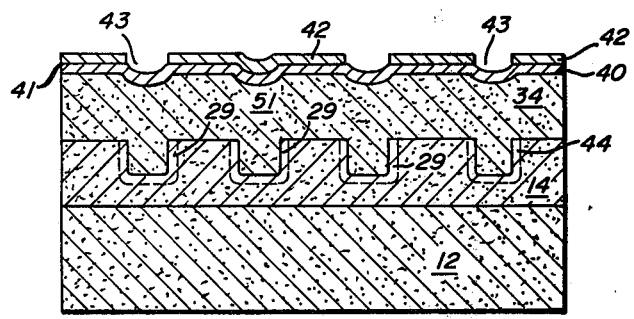
FIG. 13 is a cross-section along lines 13—13 of the structure of FIG. 12 which shows the registration between the second etch pattern and the buried gate structure.

Then, layer 42 of silicon dioxide, which may have a thickness on the order of about 3,000 angstroms, is deposited or grown on top surface 41 of contact layer 40, as illustrated in FIG. 11. An isolation-etch pattern 44 is formed by selectively removing silicon dioxide layer 42 using known photolithographic techniques to expose underlying area 43 of top surface 41, as shown in the plan view of FIG. 12. Exposed area 43 registers with the periphery of gate structure 29 as indicated in FIG. 13 and with gate conductor and contact supporting structure 33.

Figure 14:
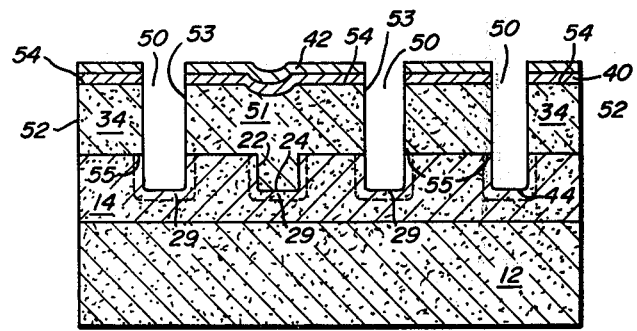
FIG. 14 illustrates the results of an anisotropic isolation and gate exposing etch of the structure of FIG. 13.
Figure 15:
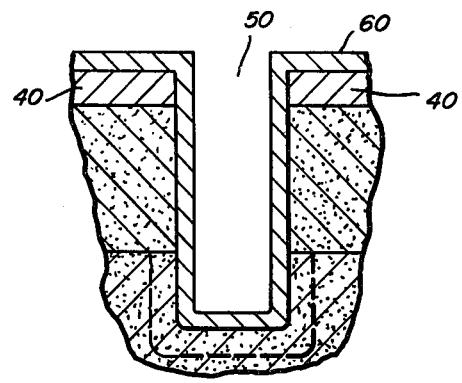
FIG. 15 illustrates a layer of silicon dioxide formed on the surfaces of the structure of FIG. 14 which were exposed by the second anisotropic etch.

Next, the exposed portions of epitaxial layer 34 are subjected to a second anisotropic etch which may also utilize a KOH base soltuion. As a result, an isolation opening 50, shown in cross-section by FIG. 14, completely surrounds source structure 51 located above gate 29 and exposes gate conductor and contact supporting structure 33 thereby preventing peripheral material 52 from shorting-out the device. Again, because second epitaxial layer 34 has a [110] crystallographic orientation, the exposed portion thereof is removed in a direction perpendiciular to surface 41 at a rate which is about 50 times greater than that of material perpendicular to the [111] planes. Hence, the side walls 53 of opening 50 are substantially perpendicular to the plane of top surface 41 of second epitaxial layer 34. Furthermore, the top surface concentration of the P+ boron gate diffusion substantially attenuates the rate at which material is removed by the second anisotropic isolation-etch to automatically terminate isolation opening 50. Therefore, the time of exposure of the semiconductor material to and the conditions of the second anisotropic etch need not be controlled as critically as would be the case if the P+ gate and gate conductor and contact supporting structure 33 were not used as an automatic etch stop. Hence, the isolation etch removes leakage paths and exposes gate conductor and contact supporting structure 33 without requiring high temperature processes, such as diffusions, which could cause the shallow peripheries of gate 29 to out-diffuse, thereby disturbing the parallel relationship of the side wall surfaces thereof. Such disturbance could either impair the electrical characteristics of the device or require a larger chip. A silicon dioxide passivation layer 60 is then grown over all exposed side and bottom surfaces of isolation opening 50, as illustrated by FIG. 15, and over gate conductor and contact support 33.

Figure 16:
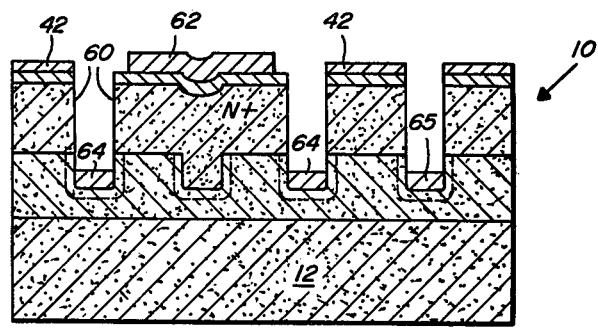
FIG. 16 is a cross-sectional view illustrating the source and gate metal.
Figure 17:
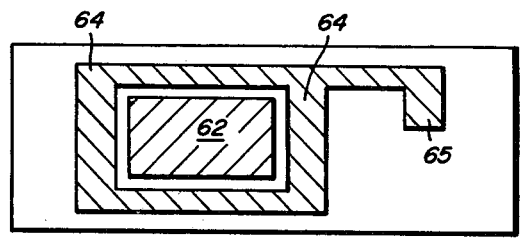
FIG. 17 is a plan view of the device of FIG. 16 illustrating the gate and source metal patterns.

Known photolighographic techniques are employed to convert the silicon dioxide layer 60 into source and gate metallization masks. Then a layer of metal is applied to the surface of wafer 10 and patterned to provide a source contact 62 and gate conductor 64 and contact 65. Vertical cross-sections of the metal conductors are illustrated in FIG. 16 and the top view thereof are shown in FIG. 17. After electrical test and back lapping, a drain contact is formed by depositing a gold layer on the bottom surface of substrate 12 in a known manner. Next, the wafer is scribed and the individual semiconductor die are separated and included in a protective housing.

Generally, in fabricating semiconductor devices capable of handling high power electrical signals, the tendency is to merely increase the size of the structures utilized in low power devices. However, as has been previously pointed out, the structures of prior art lateral FETs are not suitable for merely being enlarged to thereby provide a power FET because of the associated cost due to the large size of the resulting chips as compared to chips for bipolar transistors having similar power ratings. Moreover, prior art FETs have not been satisfactory for use in high-frequency applications because of the unpredictability of their characteristics due to curved drain-to-source channels bounded by curved, graded gate structures and because of the large parasitic capacitances and resistances associated therewith. Furthermore, buried gates of some of the prior art devices have been contacted by high temperature diffusions which tend to cause the gates thereof to out-diffuse thereby further increasing the required size and parasitic signal losses.

The process of the invention provides an improved structure for a vertical channel, junction FET operable at either high power or high frequencies or both, and which is inexpensive and reliable. As shown in FIGS. 7 and 8, the first anisotropic etch and the groove shaping techniques result in a gate structure 29 having substantially vertical side walls which define drain-to-source channel portions 26 having precisely controlled configurations and short channel lengths. The flat bottomed, U-shaped vertical cross-section of the gate and the rectangular vertical cross-sections of the source-to-drain channels result in a FET device with predictable characteristics and sharp pinch-off. More particularly, the depletion regions extends across the uniform cross-section of the channel portions in a predictable and controllable manner. Moreover, the capacitances and resistances associated with the structure are reduced to a minimum because the gate length of each device is minimized. Furthermore, the utilization of the gate itself as an etch stop for an isolation and gate exposing etch rather than isolation and gate contacting diffusions allows the shallow gate diffusion to retain its shape thereby further decreasing the amount of die area required by each device and lowering of the gate resistance. Also, the ladder-like gate configuration provides a long gate-width per unit of chip area, thus facilitating a high power handling capability as compared to prior art, lateral FETs.

We claim:
1. A method of field-effect device comprising:
   providing a first layer of semiconductor material of a first conductivity type having a selected crystallographic orientation with respect to a first surface thereof;
   selectively etching said first surface of said semiconductor material with an anisotropic etchant to remove some of said semiconductor material virtually only in a direction perpendicular to said first surface to thereby provide a plurality of juxta-positioned grooves having U-shaped cross sections in said semiconductor material, each of said grooves having an exposed bottom surface and exposed side surfaces;
   diffusing an impurity of the second conductivity type into said bottom and side surfaces of each of said grooves a predetermined distance to provide a plurality of integral juxta-positioned gate portions of the second conductivity type having bottom and side surfaces, the resulting region of said semiconductor material between said side surfaces of adjacent ones of said gate portions providing a channel;
   growing a second layer of semiconductor material of the first conductivity type in said grooves and on said first surface of said first layer of semiconductor material, said second layer being integral with said channel; and
   depositing and patterning conductive material to provide separate electrical connections to said gate and to portions of said first and second semiconductor materials to form gate, drain and source contact areas.

2. The method of claim 1 wherein said second layer of semiconductor material is of said selected crystallographic orientation and further including the step of selectively etching through said second layer of semiconductor material to expose some of said gate diffusion to facilitate the making of electrical contact to said gate.

3. The method of claim 2 wherein said gate has a continuous periphery and said step of selectively etching through said second layer of semiconductor material also exposes said periphery to provide an isolation opening.

4. The method of claim 3 wherein said gate is formed by a P+ diffusion and said anisotropic etch through said second layer of semiconductor material utilizes a potassium hydroxide based solution, and said P+ gate provides an etch stop for said anisotropic etch through said second layer of semiconductor material.

5. The method of claim 1 further including the step of rounding the corners where said surfaces of each of said grooves come together, said rounding being performed before said step of diffusing said gate, said rounding facilitating the formation of gate portions having U-shaped cross-sections formed by rectilinear, diffused side walls that are substantially of equal thickness.

6. The method of claim 5 wherein said rounding is performed by an etch step employing an etchant comprised of sulphar hexafluoride gas.

7. The method of claim 1 wherein said step of diffusing a plurality of integral gate portions is accompanied by a step of selectively retarding the diffusion through said exposed surfaces of said grooves to facilitate the formation of gate portions having U-shaped cross-sections with rectilinear side surfaces that are substantially parallel to each other.

8. The method of claim 7 wherein said selective retarding of the diffusion is accomplished by applying steam along with the gate diffusant to said exposed surfaces of said grooves.

9. A method of making a vertical channel, field effect transistor comprising:

providing a first layer of heavily doped semiconductor substrate material of a first conductivity type and having a selected crystallographic orientation with respect to a first surface and also having a second surface;

epitaxially growing a second layer of semiconductor material having said first conductivity type and said selected crystallographic orientation on said first surface of said first layer, said second layer having a third surface which is parallel to said first surface of said first layer;

selectively etching said third surface of said second layer with an anisotropic etch which removes virtually only semiconductor material in a direction perpendicular to the plane of said third surface to thereby provide a plurality of grooves each having a U-shaped cross-section in said second layer, each of said grooves having side surfaces extending in a direction substantially perpendicular to said third surface and which are joined together by a bottom surface which is substantially perpendicular to said side surfaces and which forms sharp corners therewith;

rounding said sharp corners of said grooves;

diffusing a plurality of interconnected gate portions of the second conductivity type into said side and bottom surfaces of each of said grooves while simultaneously, selectively retarding diffusion into said surfaces to thereby form gate portions having substantially U-shaped vertical cross-sections; said gate portions defining channel portions having rectangular vertical cross-sections extending in directions perpendicular to said third surface of said second layer;

epitaxially growing a third layer of semiconductor material of said first conductivity type in said grooves and on the unetched portions of said third surface of said second layer, said third layer having said selected crystallographic orientation and a fourth surface; and providing conductive connections to each of said gate and said second surface of said substrate and to said fourth surface of said third layer of semiconductor material to respectively form gate, drain and source contact areas.

10. The method of claim 9 wherein said step of providing a conductive connection to said gate includes anisotropically etching through said fourth surface provided by said third layer to virtually remove semiconductor material only in a direction perpendicular to said fourth surface to thereby provide an opening extending through said third layer of semiconductor material, said opening terminating on a gate portion.

11. The method of claim 10 wherein said gate portion provides an etch stop for said anisotropic etch of said third layer.

12. The method of claim 10 wherein said anisotropic etches are performed by utilizing potassium hydroxide based solution and said selected crystallographic orientation is [110].

* * * * *

UNITED STATES PATENT AND TRADEMARK OFFICE
CERTIFICATE OF CORRECTION

PATENT NO. : 3,938,241
DATED : February 17, 1976
INVENTOR(S) : William George et al It is certified that error appears in the above-identified patent and that said Letters Patent are hereby corrected as shown below:

In Claim 1, line 1, after "of" insert ---making a ---.

Signed and Sealed this eighteenth Day of May 1976

[SEAL]

Attest:

RUTH C. MASON
Attesting Officer

C. MARSHALL DANN
Commissioner of Patents and Trademarks